(12) United States Patent
Ahsan et al.

(10) Patent No.: US 7,781,239 B2
(45) Date of Patent: Aug. 24, 2010

(54) SEMICONDUCTOR DEVICE DEFECT TYPE DETERMINATION METHOD AND STRUCTURE

(75) Inventors: Ishtiaq Ahsan, Wallkill, NY (US); Andrew Alexander McKnight, Bronxville, NY (US); Katsunori Onishi, Fukuoka (JP); Keith Howard Tabakman, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 11/972,125

(22) Filed: Jan. 10, 2008

(65) Prior Publication Data

US 2009/0179661 A1 Jul. 16, 2009

(51) Int. Cl.
*G01R 31/26* (2006.01)
(52) U.S. Cl. .............................. 438/18; 438/14; 438/17; 257/48
(58) Field of Classification Search .................. 438/14, 438/17, 18; 257/48
See application file for complete search history.

(56) References Cited

U.S. PATENT DOCUMENTS

| | | | | |
|---|---|---|---|---|
| 6,121,631 | A * | 9/2000 | Gardner et al. | 257/48 |
| 6,287,877 | B1 * | 9/2001 | Williams et al. | 438/14 |
| 6,465,266 | B1 * | 10/2002 | Yassine et al. | 438/17 |
| 6,859,748 | B1 * | 2/2005 | Yang et al. | 702/117 |

\* cited by examiner

*Primary Examiner*—Ha Tran T Nguyen
*Assistant Examiner*—Karen M Kusumakar
(74) *Attorney, Agent, or Firm*—Schmeiser, Olsen & Watts; Ian D. MacKinnon

(57) ABSTRACT

A semiconductor defect type determination method and structure. The method includes providing a semiconductor wafer comprising a first field effect transistor (FET) comprising a first type of structure and a second FET comprising a second different type of structure. A first procedure is performed to determine if a first current flow exists between a first conductive layer formed on the first FET and a second conductive layer formed on the first FET. A second procedure is performed to determine if a second current flow exists between a third conductive layer formed the second FET and a fourth conductive layer formed on the second FET. A determination is made from combining results of the first procedure and results of the second procedure that the first FET and the second FET each comprise a specified type of defect.

11 Claims, 7 Drawing Sheets

SEMICONDUCTOR DEVICE DEFECT TYPE DETERMINATION METHOD AND STRUCTURE

FIELD OF THE INVENTION

The present invention relates to a method for determining a defect type on a semiconductor device.

BACKGROUND OF THE INVENTION

Determining potential flaws on an electrical device is typically inaccurate. Inaccurate determinations may cause the semiconductor device to fail prematurely. Accordingly, there exists a need in the art to overcome at least one of the deficiencies and limitations described herein above.

SUMMARY OF THE INVENTION

The present invention provides a method comprising:

providing a semiconductor wafer comprising a first group of field effect transistors (FET) and a second group of FETS, said first group of FETS comprising a first FET, said second group of FETS comprising a second FET, said first FET comprising a first gate structure, a first source/drain structure, and a first sidewall spacer structure, said first gate structure comprising a first gate electrode formed over a first gate insulator, said first source/drain structure comprising a first source and a first drain, said first source extending laterally in a first direction such that said first gate electrode is located directly over a portion of said first source, said first drain extending laterally in a second direction opposite said first direction such that said first gate electrode is located directly over a portion of said first drain, said second FET comprising a second gate structure, a second source/drain structure, and a second sidewall spacer structure, said second gate structure comprising a second gate electrode formed over a second gate insulator, said second source/drain structure comprising a second source and a second drain, said second gate structure not located directly over any portion of said second source or any portion of said second drain;

performing a first procedure to determine if a first current flow exists between a first conductive layer formed over said first gate electrode and a second conductive layer formed over said first source or said first drain;

performing a second procedure to determine if a second current flow exists between a third conductive layer formed over said second gate electrode and a fourth conductive layer formed over said second source or said second drain; and combining results of said first procedure and results of said second procedure to determine if said first FET and said second FET each comprise no defect, a gate insulator defect or a missing sidewall spacer defect.

The present invention provides a structure comprising:
a semiconductor wafer;
a first FET formed on said semiconductor wafer, said first FET comprising said first FET comprising a first gate structure, a first source/drain structure, and a first sidewall spacer structure, said first gate structure comprising a first gate electrode formed over a first gate insulator, said first source/drain structure comprising a first source and a first drain, said first source extending laterally in a first direction such that said first gate electrode is located directly over a portion of said first source, said first drain extending laterally in a second direction opposite said first direction such that said first gate electrode is located directly over a portion of said first drain;

a first conductive layer formed over said first gate electrode;
a second conductive layer formed over said first source;
a second FET formed on said semiconductor wafer, said second FET comprising a second gate structure, a second source/drain structure, and a second sidewall spacer structure, said second gate structure comprising a second gate electrode formed over a second gate insulator, said second source/drain structure comprising a second source and a second drain, said second gate structure not located directly over any portion of said second source or any portion of said second drain;

a third conductive layer formed over said second gate electrode;
a fourth conductive layer formed over said second source;
a first voltage source electrically connected to said first conductive layer, said first voltage source configured to generate a first voltage;
a first detection circuit electrically connected to said first voltage source and said second conductive layer, said first detection circuit configured to detect if a first current flow exists between said first conductive layer and said second conductive layer;
a second voltage source electrically connected to said third conductive layer, said second voltage source configured to generate a second voltage; and
a second detection circuit electrically connected to said second voltage source and said fourth conductive layer, said second detection circuit configured to detect if a second current flow exists between said third conductive layer and said fourth conductive layer.

The present invention provides a structure comprising:
a semiconductor wafer;
a first FET formed on said semiconductor wafer, said first FET comprising said first FET comprising a first gate structure, a first source/drain structure, and a first sidewall spacer structure, said first gate structure comprising a first gate electrode formed over a first gate insulator, said first source/drain structure comprising a first source and a first drain, said first source extending laterally in a first direction such that said first gate electrode is located directly over a portion of said first source, said first drain extending laterally in a second direction opposite said first direction such that said first gate electrode is located directly over a portion of said first drain;

a first conductive layer formed over said first gate electrode;
a second conductive layer formed over said first drain;
a second FET formed on said semiconductor wafer, said second FET comprising a second gate structure, a second source/drain structure, and a second sidewall spacer structure, said second gate structure comprising a second gate electrode formed over a second gate insulator, said second source/drain structure comprising a second source and a second drain, said second gate structure not located directly over any portion of said second source or any portion of said second drain;

a third conductive layer formed over said second gate electrode;
a fourth conductive layer formed over said second drain;
a first voltage source electrically connected to said first conductive layer, said first voltage source configured to generate a first voltage;
a first detection circuit electrically connected to said first voltage source and said second conductive layer, said first detection circuit configured to detect if a first current flow exists between said first conductive layer and said second conductive layer;

a second voltage source electrically connected to said third conductive layer, said second voltage source configured to generate a second voltage; and a second detection circuit electrically connected to said second voltage source and said fourth conductive layer, said second detection circuit configured to detect if a second current flow exists between said third conductive layer and said fourth conductive layer.

The present invention advantageously provides a simple structure and associated method for determining potential flaws on an electrical device.

DETAILED DESCRIPTION OF THE INVENTION

Figure 1:
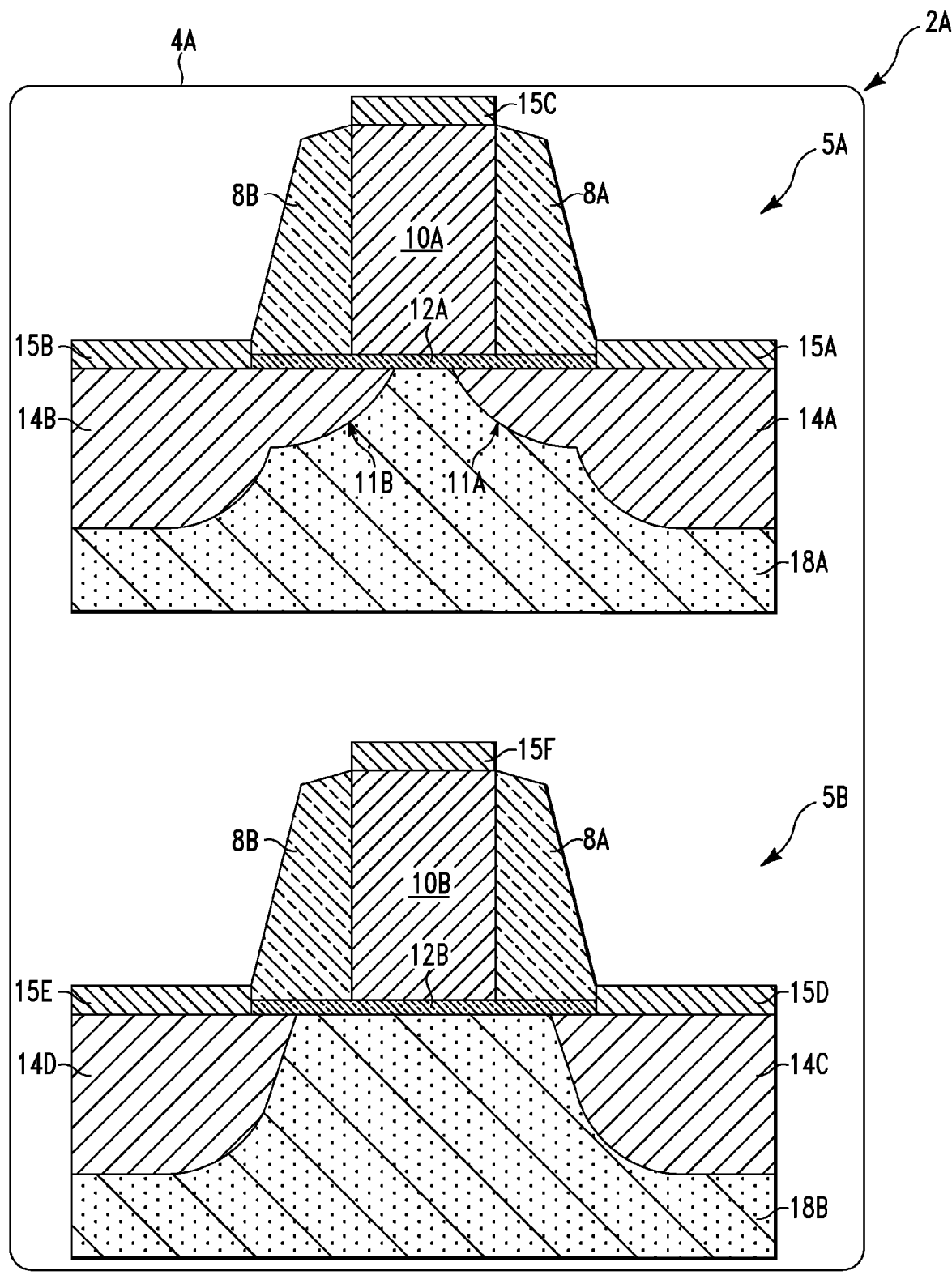
FIG. 1 illustrates a cross sectional view of a test portion of a semiconductor structure, in accordance with embodiments of the present invention.

FIG. 1 illustrates a cross sectional view of a test portion 4A of a semiconductor structure 2A, in accordance with embodiments of the present invention. Semiconductor structure 2A may comprise any type of semiconductor structure including, inter alia, a semiconductor wafer, a semiconductor chip, etc. Semiconductor structure 2A comprises a first field effect transistor (FET) 5A and a second FET 5B.

First FET 5A comprises a semiconductor substrate 18A, a source structure 14A, a drain structure 14B, a conductive layer 15A, a conductive layer 15B, a conductive layer 15C, a gate oxide layer 12A, a gate structure 10A, a sidewall spacer 8A, and a sidewall spacer 8B. Source structure 14A and drain structure 14B may be referred to as a source/drain structure. Conductive layer 15A, 15B, and 15C may comprise any type of conductive layer including, inter alia, a silicide layer, etc. Source structure 14A extends laterally such that a portion 11A of source structure 14A is located below gate structure 10A. Drain structure 14B extends laterally such that a portion 11B of drain structure 14B is located below gate structure 10A.

Second FET 5B comprises a semiconductor substrate 18B, a source structure 14C, a drain structure 14D, a conductive layer 15D, a conductive layer 15E, a conductive layer 15F, a gate oxide layer 12B, a gate structure 10B, a sidewall spacer 8A, and a sidewall spacer 8B. Source structure 14C and drain structure 14D may be referred to as a source/drain structure. Conductive layer 15D, 15E, and 15F may comprise any type of conductive layer including, inter alia, a silicide layer, etc. In contrast to FET 5A, FET 5B comprises a source structure 14C that does not extend laterally and therefore no portion of source structure 14C is located below gate structure 10B. Additionally, drain structure 14D does not extend laterally and therefore no portion of drain structure 14D is located below gate structure 10B. Semiconductor device 2A comprises additional functional FETs (i.e., FETs used on a functional portion of semiconductor device 2A and not used for test purposes) equivalent to FET 5A and 5B. FET 5A and FET 5B are used to determine FET defects (e.g., no defects, gate oxide defects, missing spacer defects, etc) for all of the FETs on semiconductor device 2A during a manufacturing process as described, infra, with respect to FIGS. 2 and 3.

Figure 2:
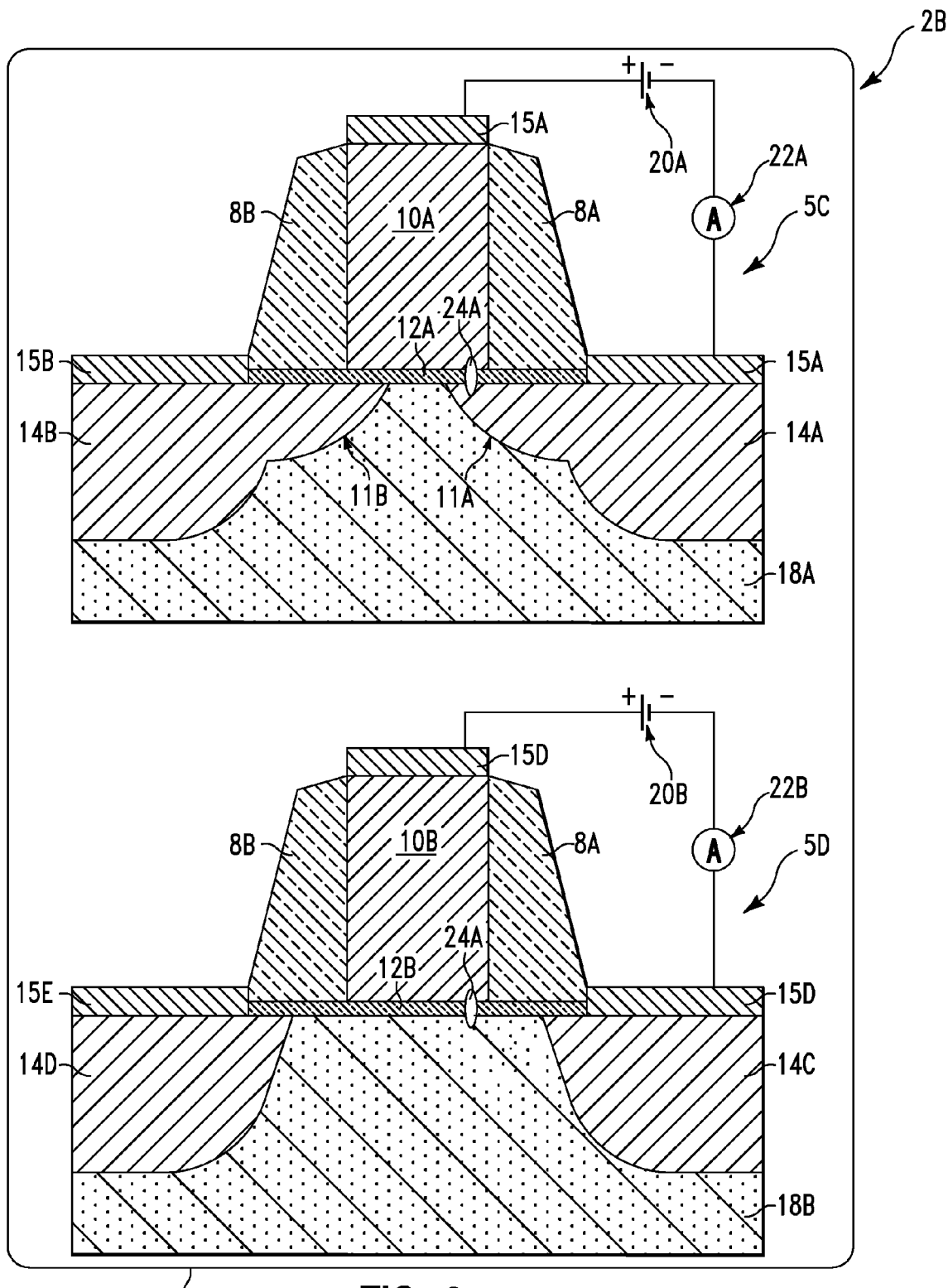
FIG. 2 depicts an alternative to FIG. 1, in accordance with embodiments of the present invention.

FIG. 2 depicts an alternative to FIG. 1 illustrating a cross-sectional view of a test portion 4B of a semiconductor structure 2B, in accordance with embodiments of the present invention. Semiconductor structure 2B comprises a FET 5C and a FET 5D. In contrast to semiconductor structure 2A of FIG. 1, semiconductor structure 2B of FIG. 2 comprises FETs (i.e., FET 5C, 5D, and all FETs of semiconductor device 2B) that each have a gate oxide defect 24A (i.e., a defect extending through a gate oxide (e.g., gate oxide 12A)). Gate oxide defect 24A (i.e., in FET 5C and all other similar FETS comprising a source/drain structure extending laterally below a gate structure on semiconductor structure 2B) comprises a conductive material that causes an unwanted short circuit between gate structure 10A and a source structure 14A of FET 5C. Although gate oxide defect 24A in FET 5C is located between gate structure 10A and source structure 14A, note that gate oxide defect 24A could have alternatively formed between gate structure 10A and a drain structure 14B (and between all gate and drain structures on all FETs on semiconductor structure 2B). Gate oxide defect 24A may have been formed accidentally during a manufacturing process. Gate oxide defect 24A in FET 5D and all other similar FETS comprising a source/drain structure that does not extend laterally below a gate structure on semiconductor structure 2B does not form a short between a gate structure 10B and a source structure 14C (or drain structure 14D) because the source/drain structure does not extend laterally below a gate structure. Placing FET 5C and 5D (i.e., comprising different types of source/drain structures) on semiconductor device 2B enables detection of different types of FET defects. Additionally, FET 5C and 5D (i.e., comprising different types of source/drain structures) enable distinguishing different types of FET defects from each other (e.g., gate oxide defects 24A as opposed to another type of FET defect such as a missing spacer defect) as described, infra.

In order to distinguish different types of FET defects from each other, a voltage 20A (e.g., from a voltage source such, inter alia, as a battery, a power supply, etc) is applied between conductive layer 15A and 15C on FET 5C and a current measurement device 22A (e.g., a voltage divider) is placed between a voltage source supplying voltage 20A and conductive layer 15A. Additionally, a voltage 20B (e.g., from a voltage source such, inter alia, as a battery, a power supply, etc) is applied between conductive layer 15D and 15F on FET 5D and a current measurement device 22B (e.g., a voltage divider) is placed between a voltage source supplying voltage 20B and conductive layer 15D. When voltage 20A is applied to FET 5C, a closed circuit is formed by gate oxide defect 24A and a current is measured by current measurement device 22A (i.e., voltage 20A is conducted from a voltage source through conductive layer 15C, gate structure 10A, gate defect 24A, source structure 14A, conductive layer 15A, current measurement device 22A, and back to the voltage source). Conversely, when voltage 20B is applied to FET 5D, source structure 14C (i.e., without a lateral portion extending below drain structure 10B) causes an open circuit (i.e., prevents a closed circuit formed by gate oxide defect 24A because semiconductor substrate 15B comprises a non-conductive material) and therefore a current is not measured by current measurement device 22B. By applying the aforementioned voltages to FETS 5C and 5D and measuring a current value between conductive layers 15A and 15C (current flow existing) and between conductive layers 15D and 15 F (no current flow existing), one is able to determine that FET 5C, FET 5D, and all of the other functional FETS located on semiconductor structure 2B each comprise a gate oxide defect (i.e., current flow is measured on FET 5C but not on FET 5D).

Figure 3:
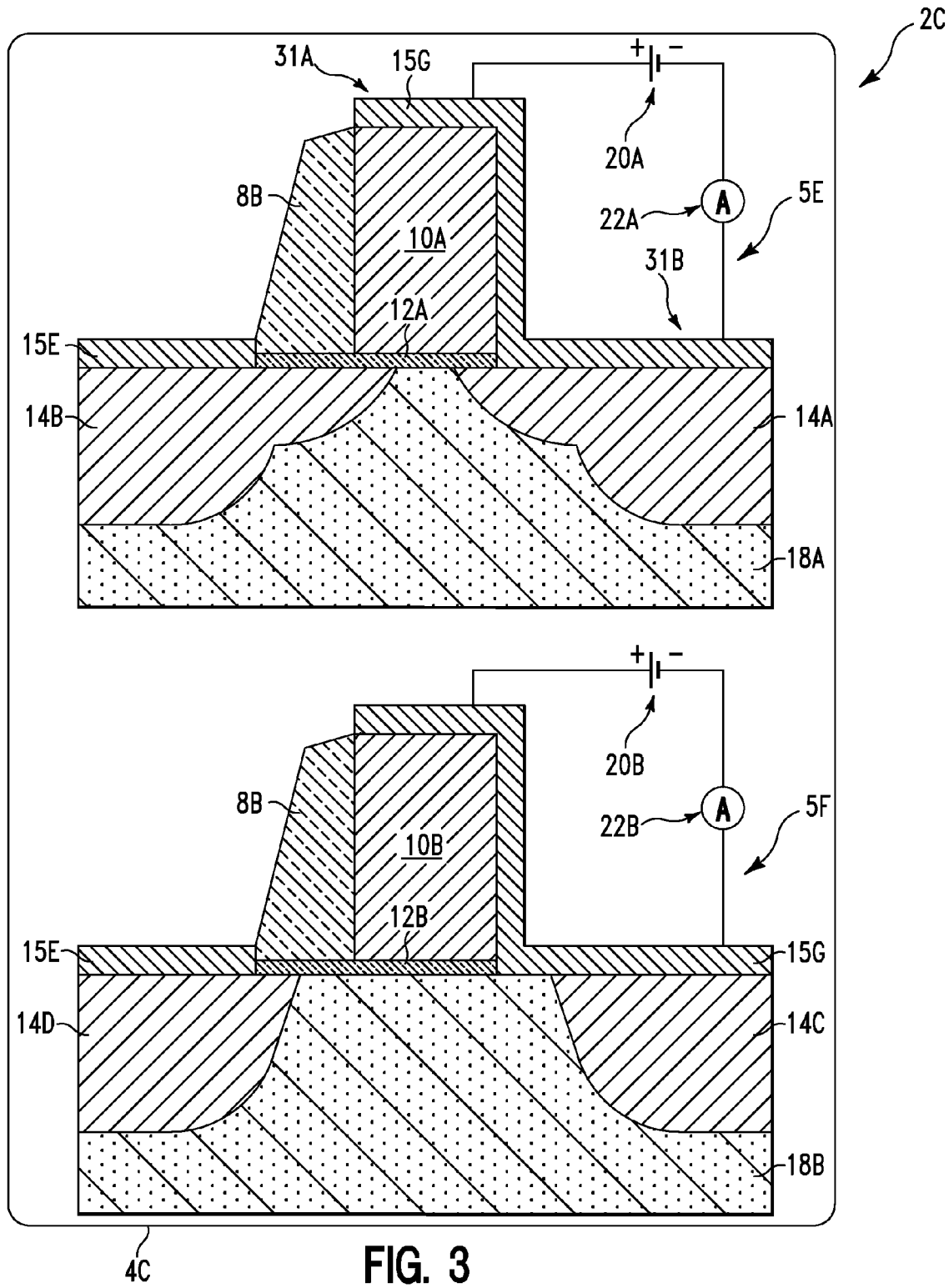
FIG. 3 depicts a first alternative to FIG. 2, in accordance with embodiments of the present invention.

FIG. 3 depicts a first alternative to FIG. 2 illustrating a cross-sectional view of a test portion 4C of a semiconductor structure 2C, in accordance with embodiments of the present invention. Semiconductor structure 2C comprises a FET 5E and a FET 5F. In contrast to semiconductor structure 2B of FIG. 2, semiconductor structure 2C of FIG. 3 comprises FETs (i.e., FET 5E, 5F, and all FETs of semiconductor device 2C) that do not comprise a gate oxide defect but that are each missing a sidewall spacer (i.e., spacer 8A from FIGS. 1 and 2 is missing). During a manufacturing process, the missing side wall spacer allows a single conductive layer 15G (e.g., silicide) to form over and down a side surface of gate structure 10A and over source structure 14A. Additionally, FIG. 3 illustrates a missing side wall spacer (i.e., spacer 8A in FIGS. 1 and 2) allowing a single conductive layer 15G (e.g., silicide) to form over and down a side surface of gate structure 10B and over source structure 14C. FIG. 3 could alternatively comprise a different missing sidewall spacer (e.g., sidewall spacer 8B of FIGS. 1 and 2) thereby allowing a single conductive layer (e.g., silicide) to form over and down a side surface of gate structure 10A and over source structure 14B and over and down a side surface of gate structure 10B and over source structure 14D. The missing sidewall spacer may have been caused accidentally during a manufacturing process. The single conductive layer 15G (i.e., in FET 5E and 5F and all other similar FETS on semiconductor structure 2C) causes a short circuit between each gate structure and each source structure.

Placing FET 5E and 5F (i.e., comprising different types of source/drain structures) on semiconductor device 2C enables detection of different types of FET defects. Additionally, FET 5E and 5F (i.e., comprising different types of source/drain structures) enable distinguishing different types of FET defects from each other (e.g., a missing spacer defect as opposed to another type of FET defect such as gate oxide defects) as described, infra.

As with the procedure described with reference to FIG. 2, a voltage 20A (e.g., from a voltage source such, inter alia, as a battery, a power supply, etc) is applied between portion 31A and 31B of conductive layer 15G on FET 5E and a current measurement device 22A (e.g., a voltage divider) is placed between a voltage source supplying voltage 20A and portion 31B of conductive layer 15G. Additionally, a voltage 20B (e.g., from a voltage source such, inter alia, as a battery, a power supply, etc) is applied between portion 31A and 31B of conductive layer 15G on FET 5F and a current measurement device 22B (e.g., a voltage divider) is placed between a voltage source supplying voltage 20B and portion 31B of conductive layer 15G. When voltage 20A is applied to FET 5E, a closed circuit is formed by conductive layer 15G and a current is measured by current measurement device 22A (i.e., voltage 20A is conducted from a voltage source through conductive layer 15G, current measurement device 22A, and back to the voltage source). Likewise, when voltage 20B is applied to FET 5F, a closed circuit is formed by conductive layer 15G and a current is measured by current measurement device 22B (i.e., voltage 20B is conducted from a voltage source through conductive layer 15G, current measurement device 22B, and back to the voltage source). By applying the aforementioned voltages to FETS 5E and 5F and measuring a current value between conductive portions 31A and 31B of conductive layer 15g (i.e., current flow existing), one is able to determine that FET 5E, FET 5F, and all of the other functional FETS located on semiconductor structure 2C each comprise a missing sidewall spacer.

Therefore, by placing two different style FETS (i.e., some FETS comprising source/drain structures extending laterally below a gate structure as illustrated by FETS 5A, 5C, and 5E and some FETS comprising source/drain structures that do not extend laterally below a gate structure as illustrated by FETS 5B, 5D, and 5F) one is able to determine if FETS on a semiconductor structure comprise a gate oxide defect (i.e., current flow only on one type of FET) or a missing sidewall spacer defect (i.e., current flow only on both types of FETS).

Figure 4:
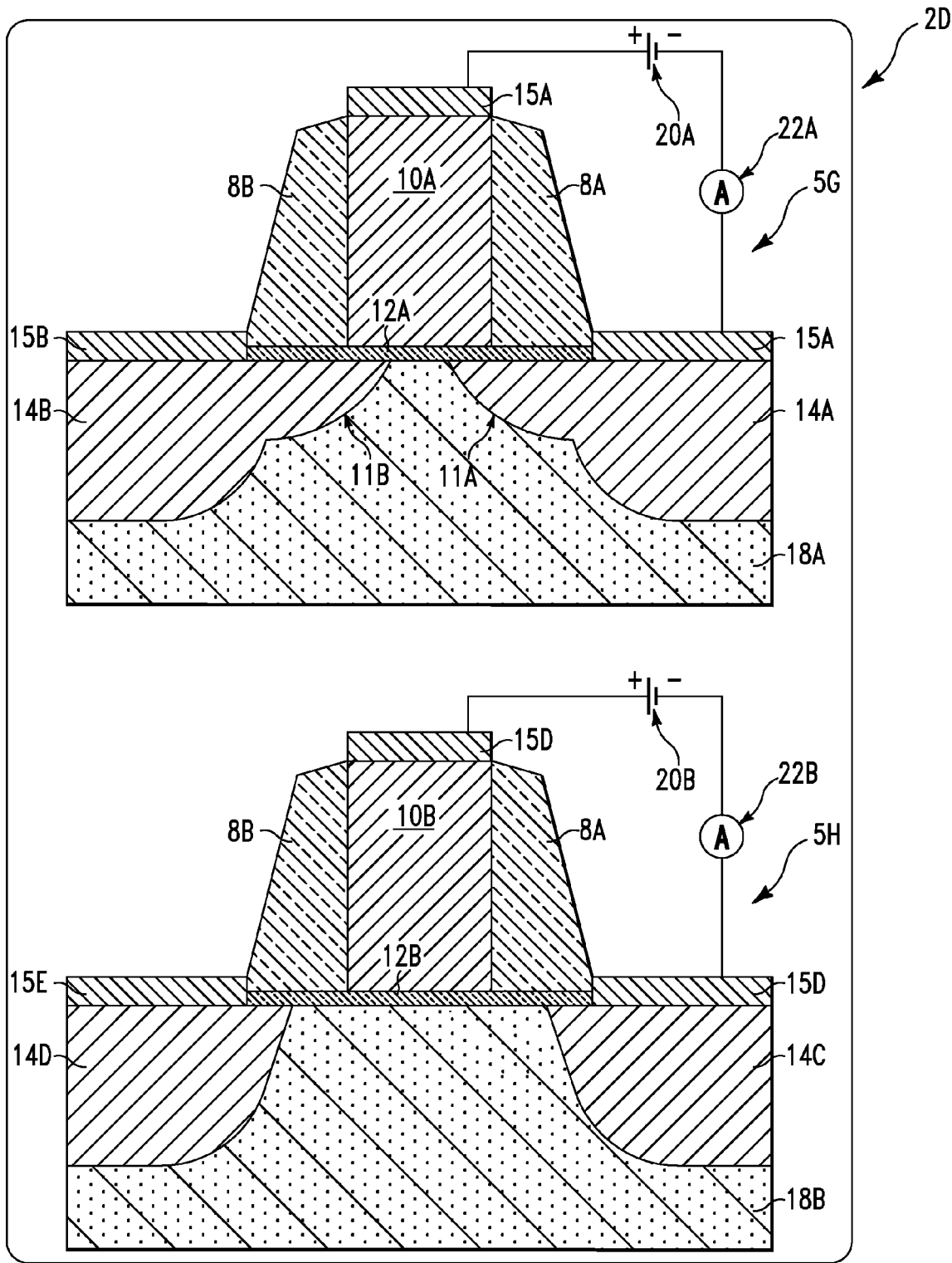
FIG. 4 depicts a second alternative to FIG. 2, in accordance with embodiments of the present invention.

FIG. 4 depicts a second alternative to FIG. 2 illustrating a cross-sectional view of a test portion 4D of a semiconductor structure 2D, in accordance with embodiments of the present invention. Semiconductor structure 2D comprises a FET 5G and a FET 5H. In contrast to semiconductor structure 2B of FIG. 2, semiconductor structure 2D of FIG. 4 does not comprise any defect.

As with the procedure described with reference to FIG. 2, a voltage 20A (e.g., from a voltage source such, inter alia, as a battery, a power supply, etc) is applied between conductive layer 15C on FET 5G and a current measurement device 22A (e.g., a voltage divider) is placed between a voltage source supplying voltage 20A and conductive layer 15A. Additionally, a voltage 20B (e.g., from a voltage source such, inter alia, as a battery, a power supply, etc) is applied between conductive layer 15F on FET 5H and a current measurement device 22B (e.g., a voltage divider) is placed between a voltage source supplying voltage 20B and conductive layer 15D. When voltage 20A is applied to FET 5G, an open circuit is detected and no current is measured by current measurement device 22A. Likewise, when voltage 20B is applied to FET 5H, an open circuit is detected and no current is measured by current measurement device 22B. By applying the aforementioned voltages to FETS 5G and 5H and measuring a current values between conductive layers, one is able to determine that FET 5G, FET 5H, and all of the other functional FETS located on semiconductor structure 2D each comprise no defects.

Therefore, by placing two different style FETS (i.e., some FETS comprising source/drain structures extending laterally below a gate structure as illustrated by FET 5G and some FETS comprising source/drain structures that do not extend laterally below a gate structure as illustrated by FETS 5H) one is able to determine that FETS on a semiconductor structure do not comprise any defects.

Figure 5:
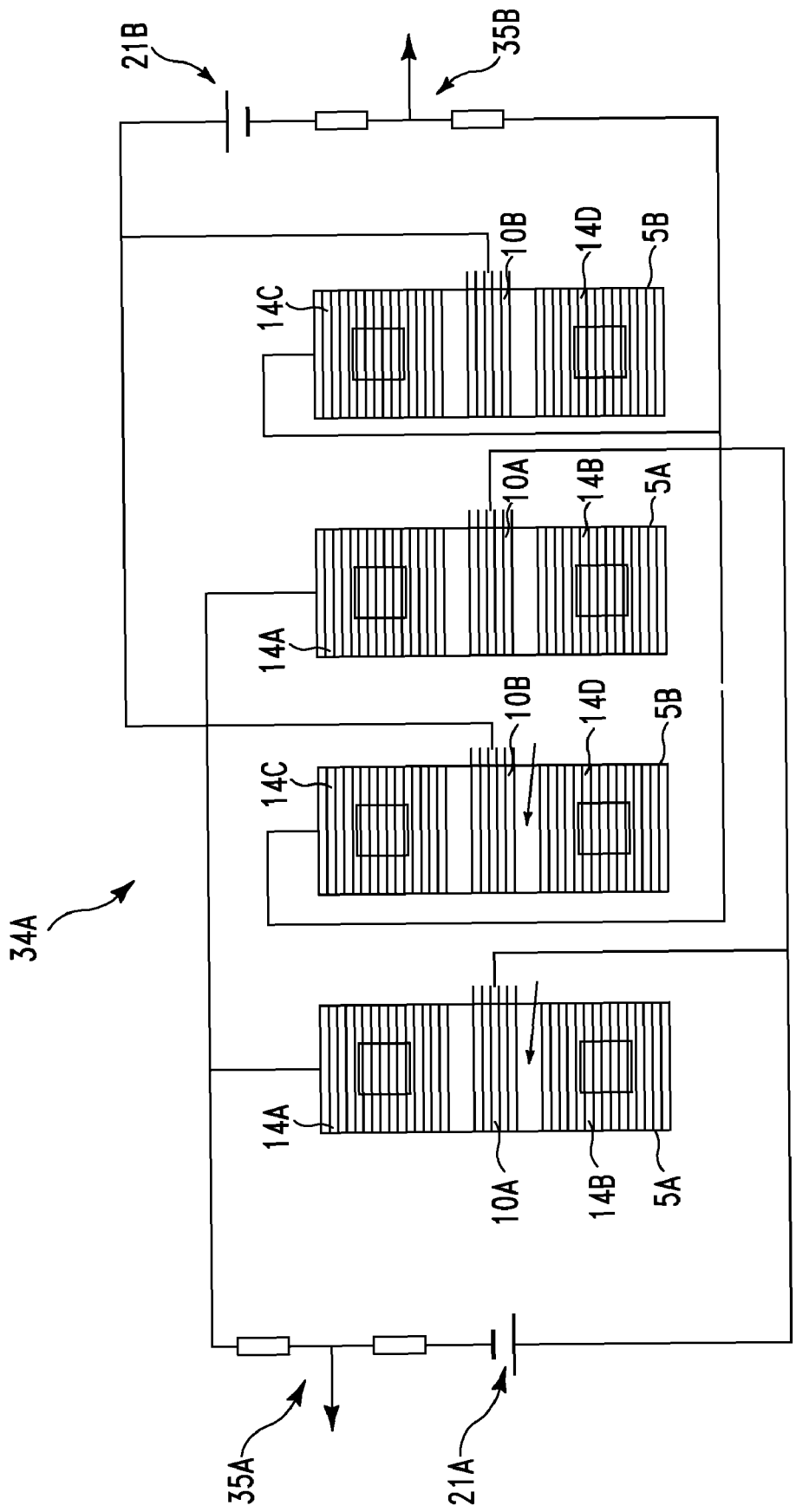
FIG. 5 illustrates a top view of a test portion of a semiconductor structure, in accordance with embodiments of the present invention.

FIG. 5 illustrates a top view of a test portion of a semiconductor structure, in accordance with embodiments of the present invention. The test portion illustrated in FIG. 4 is applicable to any of semiconductor structures 2A . . . 2C. A circuit 34A illustrated in FIG. 4 comprises a plurality of FETS 5A (i.e., source structures 14A) electrically connected to a voltage source 21A and a voltage divider circuit 35A and a plurality of FETS 5B (i.e., source structures 14C) electrically connected to a voltage source 21B and a voltage divider circuit 35B. Circuit 34A provides a means for identification of systematic defects that are preferential to one side of FETS 5A and 5B (i.e., a gate oxide or missing spacer defect causing a source to gate short circuit). In circuit 34A, a voltage is applied by voltage source 21A and 21B and a current is sensed using voltage divider circuits 35A and 35B. If any of FETS 5A comprise a gate oxide or missing spacer defect (i.e., gate to source short circuit), a current will flow and voltage divider circuit 35A will register a voltage indicating current flow. Similarly, if any of FETS 5B comprise a gate oxide or missing spacer defect (i.e., gate to source short circuit), a current will flow and voltage divider circuit 35B will register a voltage indicating current flow. Based on the current flow indicated, it may be determined if FETS 5A and 5B comprise a gate oxide defect or a missing spacer defect as described, supra.

Figure 6:
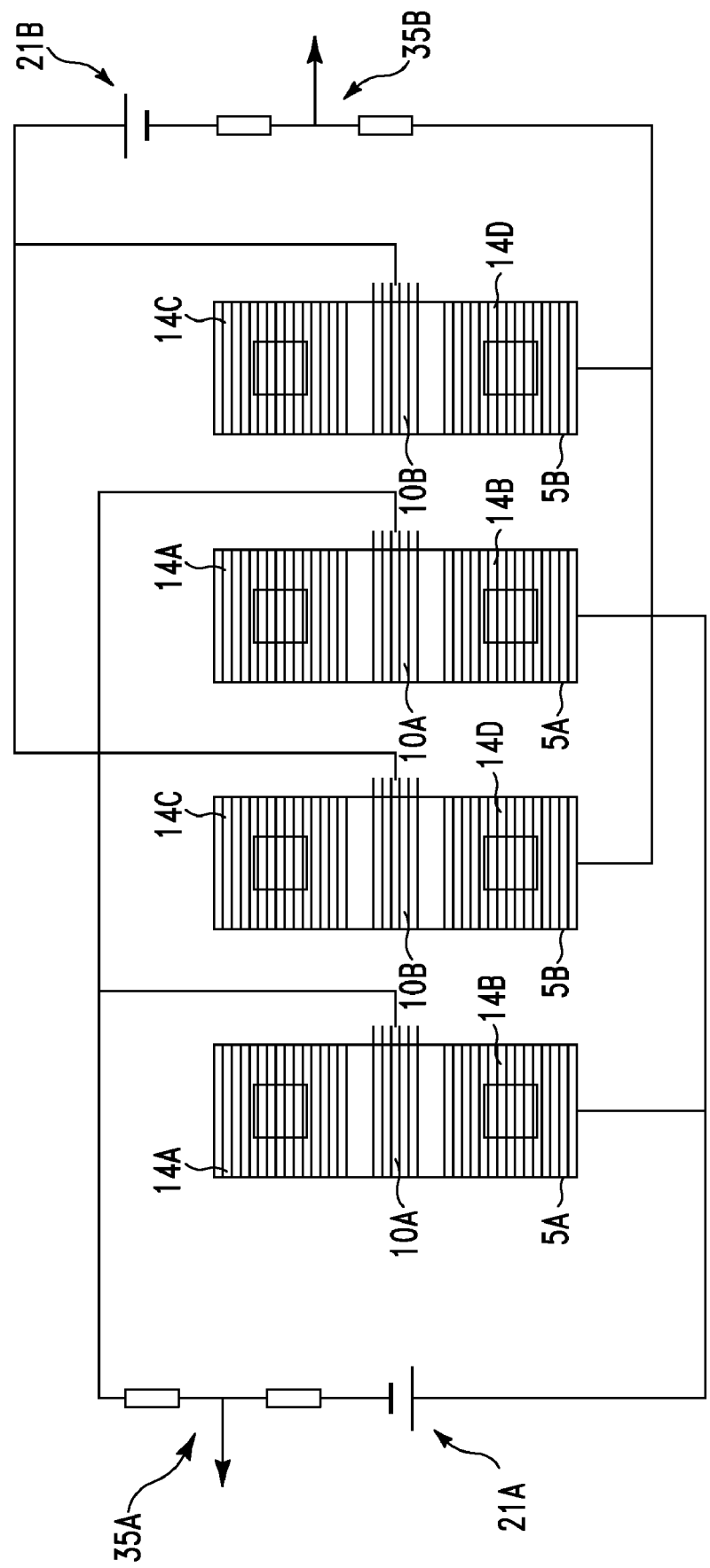
FIG. 6 depicts an alternative to FIG. 5, in accordance with embodiments of the present invention.

FIG. 6 illustrates a top view of a test portion of a semiconductor structure, in accordance with embodiments of the present invention. The test portion illustrated in FIG. 5 is applicable to any of semiconductor structures 2A ... 2C. Circuit 34B illustrated in FIG. 5 comprises an opposite configuration to circuit 34A of FIG. 4. In circuit 34B, a plurality of FETS 5A (i.e., drain structures 14B) are electrically connected to a voltage source 21A and a voltage divider circuit 35A and a plurality of FETS 5B (i.e., drain structures 14D) are electrically connected to a voltage source 21B and a voltage divider circuit 35B. Circuit 34A provides a means for identification of systematic defects that are preferential to one side of FETS 5A and 5B (i.e., a gate oxide or missing spacer defect causing a drain to gate short circuit). In circuit 34A, a voltage is applied by voltage source 21A and 21B and a current is sensed using voltage divider circuits 35A and 35B. If any of FETS 5A comprise a gate oxide or missing spacer defect (i.e., gate to drain short circuit), a current will flow and voltage divider circuit 35A will register a voltage indicating current flow. Similarly, if any of FETS 5B comprise a gate oxide or missing spacer defect (i.e., gate to drain short circuit), a current will flow and voltage divider circuit 35B will register a voltage indicating current flow. Based on the current flow indicated, it may be determined if FETS 5A and 5B comprise a gate oxide defect or a missing spacer defect as described, supra.

Figure 7:
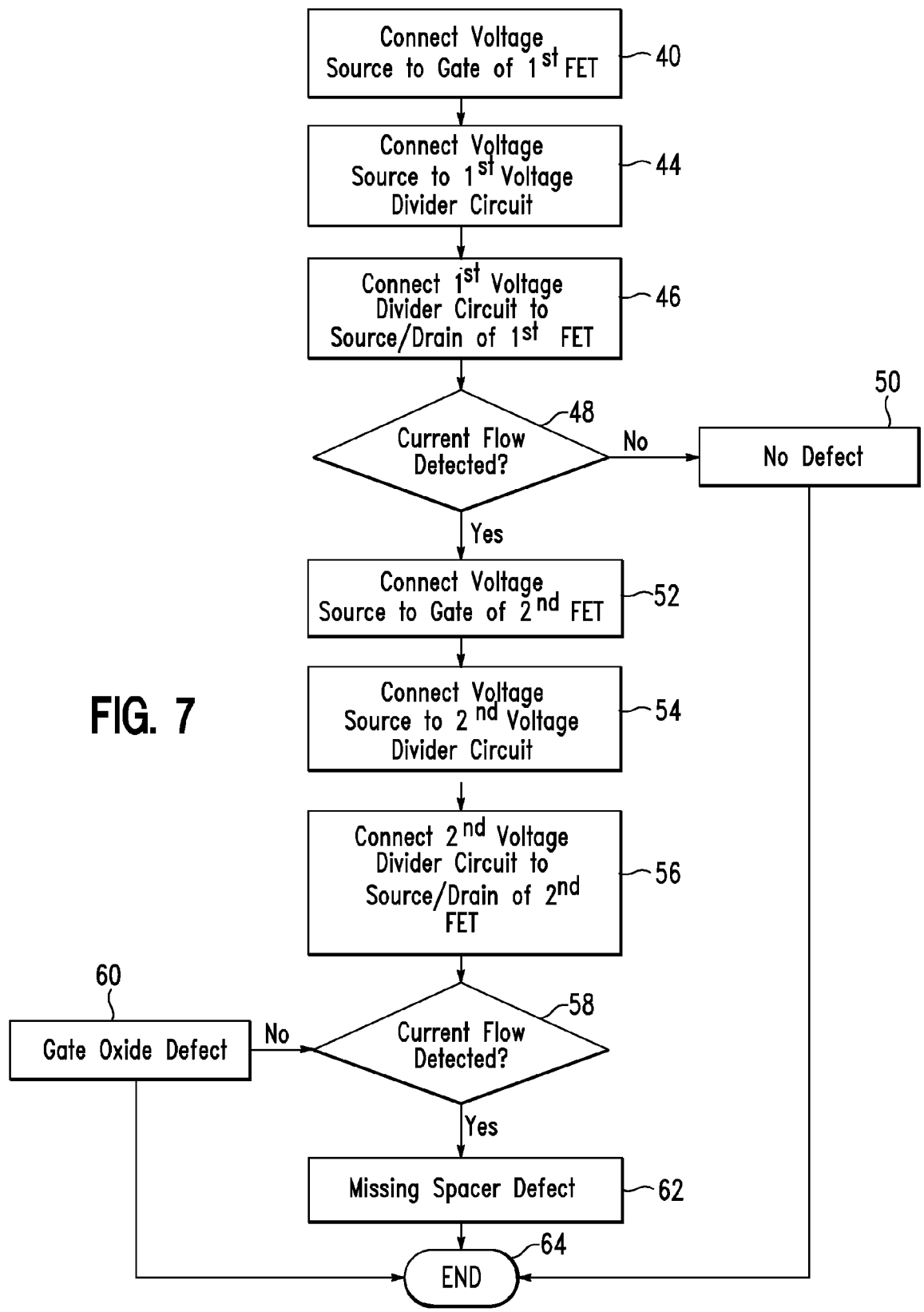
FIG. 7 illustrates a flowchart describing an algorithm used to determine FET defect types for FETs, in accordance with embodiments of the present invention.

FIG. 7 illustrates a flowchart describing an algorithm used to determine FET defect types for FETs on semiconductor devices 2A-2D of FIGS. 1-6, in accordance with embodiments of the present invention. In step 40, a positive lead for a $1^{st}$ voltage source is electrically connected to a gate contact (e.g., conductive layer 15C) for a $1^{st}$ FET(s) (e.g., FET 5A of FIG. 1 comprising a source/drain structure extending laterally below a gate structure). In step 44, a negative lead for the $1^{st}$ voltage source is electrically connected to a voltage divider circuit (e.g., current measurement device 22A of FIG. 2). In step 46, the voltage divider circuit (e.g., current measurement device 22A of FIG. 2) is electrically connected to a source/drain gate contact (e.g., conductive layer 15A or 15B) for the $1^{st}$ FET(s) (e.g., FET 5A of FIG. 1). In step 48, it is determined if a current flow has been detected.

If in step 48, it is determined that a current flow has not been detected then in step 50, it is determined that none the FETS of the semiconductor device comprises a gate oxide or sidewall spacer defect and the process is terminated in step 64.

If in step 48, it is determined that a current flow has been detected then in step 52, a positive lead for a $2^{nd}$ voltage source is electrically connected to a gate contact (e.g., conductive layer 15F) for a $2^{nd}$ FET(s) (e.g., FET 5B of FIG. 1 comprising a source/drain structure that does not extend laterally below a gate structure). In step 54, a negative lead for the $2^{nd}$ voltage source is electrically connected to a voltage divider circuit (e.g., current measurement device 22B of FIG. 2). In step 56, the voltage divider circuit (e.g., current measurement device 22B of FIG. 2) is electrically connected to a source/drain gate contact (e.g., conductive layer 15D or 15E) for the $2^{nd}$ FET(s) (e.g., FET 5B of FIG. 1). In step 58, it is determined if a current flow has been detected.

If in step 58, it is determined that a current flow has been detected then in step 62, it is determined that all the FETS of the semiconductor device comprises a sidewall spacer defect and the process is terminated in step 64.

If in step 58, it is determined that a current flow has not been detected then in step 60, it is determined that all the FETS of the semiconductor device comprises a gate oxide defect and the process is terminated in step 64.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method comprising:
    providing a semiconductor wafer comprising a first group of field effect transistors (FET) and a second group of FETS, said first group of FETS comprising a first FET, said second group of FETS comprising a second FET, said first FET comprising a first gate structure, a first source/drain structure, and a first sidewall spacer structure, said first gate structure comprising a first gate electrode formed over a first gate insulator, said first source/drain structure comprising a first source and a first drain, said first source extending laterally in a first direction such that said first gate electrode is located directly over a portion of said first source, said first drain extending laterally in a second direction opposite said first direction such that said first gate electrode is located directly over a portion of said first drain, said second FET comprising a second gate structure, a second source/drain structure, and a second sidewall spacer structure, said second gate structure comprising a second gate electrode formed over a second gate insulator, said second source/drain structure comprising a second source and a second drain, said second gate structure not located directly over any portion of said second source or any portion of said second drain;
    performing a first procedure to determine if a first current flow exists between a first conductive layer formed over said first gate electrode and a second conductive layer formed over said first source or said first drain;
    performing a second procedure to determine if a second current flow exists between a third conductive layer formed over said second gate electrode and a fourth conductive layer formed over said second source or said second drain; and
    combining results of said first procedure and results of said second procedure to determine if said first FET and said second FET each comprise no defect, a gate insulator defect or a missing sidewall spacer defect.

2. The method of claim 1, wherein said first measuring determines that said first current flow does not exist, wherein said second measuring determines that said second current flow does not exist, and wherein said first FET and said second FET are determined to comprise no defect.

3. The method of claim 2, wherein said combining said results of said first procedure and said results of said second procedure determine that each FET of said first group of FETS and each FET of said second group of FETS comprise no defect.

4. The method of claim 1, wherein said first procedure determines that said first current flow exists, wherein said second procedure determines that said second current flow exists, wherein said first FET and said second FET are determined to comprise said missing sidewall spacer defect, wherein said first sidewall spacer structure consists of a single sidewall spacer, and wherein said second sidewall spacer structure consists of a single sidewall spacer.

5. The method of claim 4, wherein said combining said results of said first procedure and said results of said second procedure determine that each FET of said first group of FETS and each FET of said second group of FETS comprise said missing sidewall spacer defect.

6. The method of claim 1, wherein said first measuring determines that said first current flow exists, wherein said second measuring determines that said second current flow does not exist, and first FET and said second FET are determined to comprise said gate insulator defect, wherein said first gate insulator comprises a first conductive material extending through said first gate insulator, and wherein said second gate insulator comprises a second conductive material extending through said second gate insulator.

7. The method of claim 6, wherein said combining said results of said first procedure and said results of said second procedure determine that each FET of said first group of FETS and each FET of said second group of FETS comprise said gate insulator defect.

8. The method of claim 1, further comprising:
providing a first voltage divider circuit and a second voltage divider circuit, said first voltage divider circuit electrically connected to said first conductive layer and said second conductive layer, said second voltage divider circuit electrically connected to said third conductive layer and said fourth conductive layer, wherein said performing a first procedure comprises applying a first voltage between said first conductive layer and said second conductive layer and measuring an output of said first voltage divider circuit to determine if a first output voltage exists, wherein said first output voltage is associated with said first current flow, wherein said performing said second first procedure comprises applying a second voltage between said third conductive layer and said fourth conductive layer and measuring an output of said second voltage divider circuit to determine if a second output voltage exists, and wherein said second output voltage is associated with said second current flow.

9. The method of claim 1, wherein said first conductive layer, said second conductive layer, said third conductive layer, and said fourth conductive layer each comprise a silicide layer.

10. The method of claim 1, wherein said first conductive layer is in contact with said first gate electrode, wherein said second conductive layer is in contact with said first source or said first drain, wherein said third conductive layer is in contact with said second gate electrode, and wherein said fourth conductive layer is in contact with said second source or said second drain.

11. The method of claim 1, wherein said first FET and said second FET are located within a test site location on said semiconductor wafer.

* * * * *